(12) United States Patent
Aoki et al.

(10) Patent No.: US 12,446,403 B2
(45) Date of Patent: Oct. 14, 2025

(54) DISPLAY DEVICE AND METHOD OF MANUFACTURING DISPLAY DEVICE

(71) Applicant: SHARP KABUSHIKI KAISHA, Osaka (JP)

(72) Inventors: Tomohisa Aoki, Sakai (JP); Atsushi Hachiya, Sakai (JP); Yuhichi Saitoh, Sakai (JP); Hiroaki Furukawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 437 days.

(21) Appl. No.: 17/927,000

(22) PCT Filed: May 25, 2020

(86) PCT No.: PCT/JP2020/020497
§ 371 (c)(1),
(2) Date: Nov. 22, 2022

(87) PCT Pub. No.: WO2021/240584
PCT Pub. Date: Dec. 2, 2021

(65) Prior Publication Data
US 2023/0209893 A1   Jun. 29, 2023

(51) Int. Cl.
*H01L 29/08*   (2006.01)
*H10D 30/67*   (2025.01)
(Continued)

(52) U.S. Cl.
CPC ..... *H10K 59/1213* (2023.02); *H10D 30/6745* (2025.01); *H10D 30/6755* (2025.01);
(Continued)

(58) Field of Classification Search
CPC ............. H10K 59/1213; H10K 59/131; H10K 59/1216; H10D 30/6745; H10D 30/6755
(Continued)

(56) References Cited

U.S. PATENT DOCUMENTS

2015/0053935 A1   2/2015   Gupta et al.
2015/0054799 A1   2/2015   Chang et al.
(Continued)

FOREIGN PATENT DOCUMENTS

KR        102280265 B1 *   7/2021   ......... H10D 30/6704
WO      2015031037 A1      3/2015

*Primary Examiner* — Phuc T Dang
(74) *Attorney, Agent, or Firm* — ScienBiziP, P.C.

(57) ABSTRACT

A display device includes a pixel circuit and a light-emitting element, the pixel circuit including: a transistor with a first structure including a crystalline silicon semiconductor film and a first gate electrode; and a transistor with a second structure including an oxide semiconductor film and a second gate electrode, the display device further includes: a first interlayer insulation film; and a second interlayer insulation film, wherein the pixel circuit includes: a drive transistor that has the first structure: and a capacitive element, the capacitive element includes: a first capacitor electrode electrically connected to a first gate electrode of the drive transistor; a second capacitor electrode opposite the first capacitor electrode; and a dielectric film between the first capacitor electrode and the second capacitor electrode, and the dielectric film is disposed in a different layer than are the first interlayer insulation film and the second interlayer insulation film.

18 Claims, 15 Drawing Sheets

(51) Int. Cl.
    *H10K 59/12*     (2023.01)
    *H10K 59/121*    (2023.01)
    *H10K 59/131*    (2023.01)
(52) U.S. Cl.
    CPC ..... *H10K 59/1201* (2023.02); *H10K 59/1216* (2023.02); *H10K 59/131* (2023.02)
(58) Field of Classification Search
    USPC .......................................................... 257/40
    See application file for complete search history.

(56) References Cited

U.S. PATENT DOCUMENTS

| | | |
|---|---|---|
| 2015/0055047 A1 | 2/2015 | Chang et al. |
| 2015/0055051 A1 | 2/2015 | Osawa et al. |
| 2018/0033805 A1 | 2/2018 | Gupta et al. |
| 2019/0006394 A1 | 1/2019 | Gupta et al. |
| 2019/0305065 A1* | 10/2019 | Kim .................... H10D 86/481 |
| 2020/0075636 A1 | 3/2020 | Gupta et al. |
| 2020/0335528 A1 | 10/2020 | Gupta et al. |
| 2021/0225890 A1 | 7/2021 | Osawa et al. |
| 2022/0037374 A1 | 2/2022 | Gupta et al. |

* cited by examiner

DISPLAY DEVICE AND METHOD OF MANUFACTURING DISPLAY DEVICE

TECHNICAL FIELD

The disclosure relates to display devices.

BACKGROUND ART

Patent Literature 1 discloses a display device including, on a single substrate, a polysilicon-containing transistor, a semiconductor-oxide-containing transistor, and a capacitive element connected to the polysilicon-containing transistor.

CITATION LIST

Patent Literature

Patent Literature 1: PCT International Application Publication No. WO20151031037

SUMMARY

Technical Problem

The display device of Patent Literature 1 has an issue that capacitance is difficult to optimize because the gate electrode of the polysilicon-containing transistor is covered with an insulation film that also serves as a dielectric film of the capacitive element.

Solution to Problem

The disclosure, in one aspect thereof, is directed to a display device including a pixel circuit and a light-emitting element, the pixel circuit including: a transistor with a first structure including a crystalline silicon semiconductor film and a first gate electrode; and a transistor with a second structure including an oxide semiconductor film and a second gate electrode, the display device further including: a first interlayer insulation film covering the first gate electrode; and a second interlayer insulation film covering the second gate electrode, wherein the pixel circuit includes: a drive transistor that has the first structure; and a capacitive element, the capacitive element includes: a first capacitor electrode electrically connected to a first gate electrode of the drive transistor; a second capacitor electrode opposite the first capacitor electrode; and a dielectric film between the first capacitor electrode and the second capacitor electrode, and the dielectric film is disposed in a different layer than are the first interlayer insulation film and the second interlayer insulation film.

Advantageous Effects

In an aspect of the disclosure, since the dielectric film of the capacitive element is disposed in a different layer than are the first interlayer insulation film and the second interlayer insulation film, it is advantageously easy to optimize the capacitance.

DESCRIPTION OF EMBODIMENTS

FIG. 1(a) is a schematic plan view of a structure of a display device in accordance with the present embodiment. FIG. 1(b) is a cross-sectional view of the structure of the display device. FIG. 2 is a cross-sectional view of the structure of the display device in accordance with the present embodiment.

Figure 1:
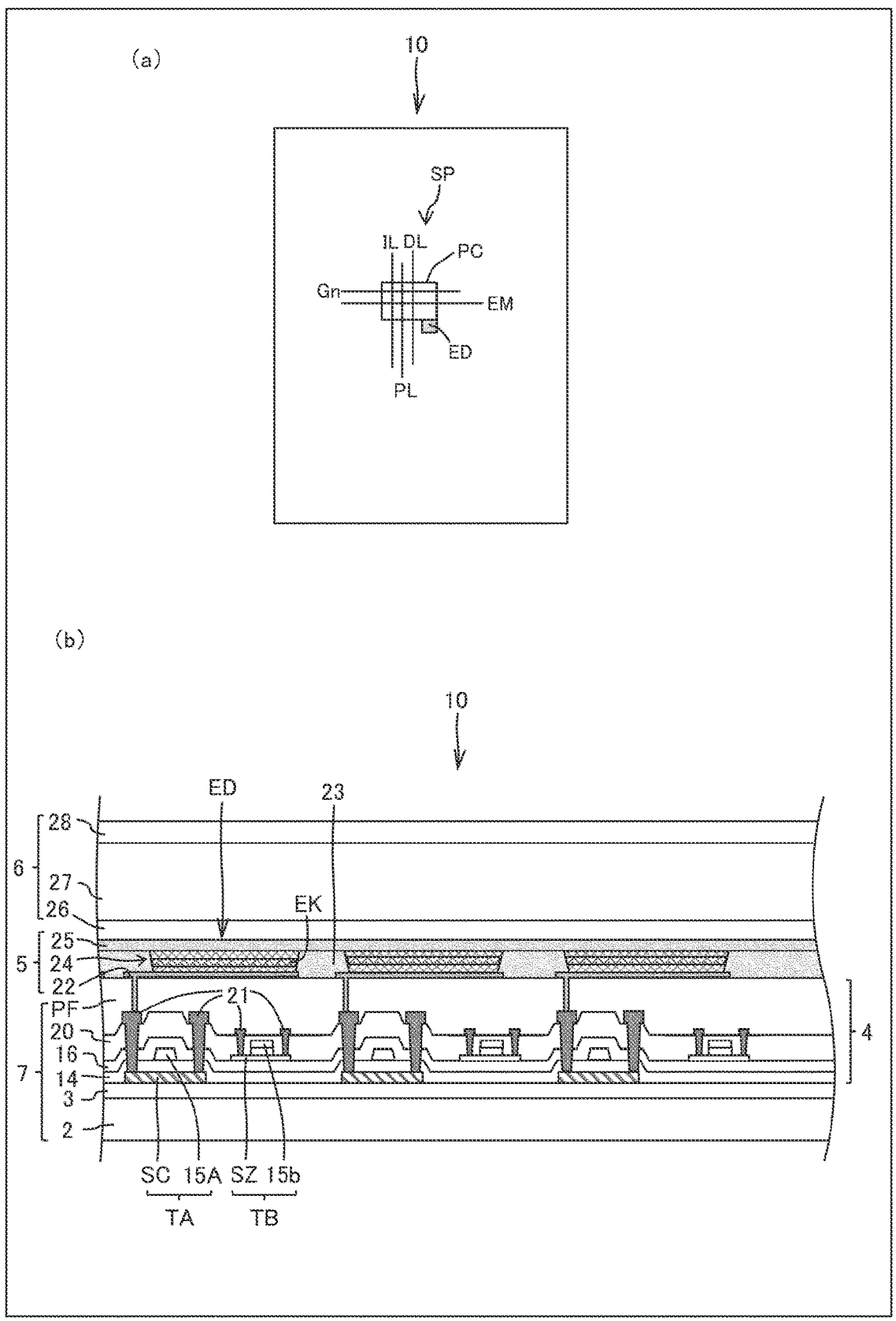
FIG. 1(a) is a schematic plan view of a structure of a display device in accordance with the present embodiment.
FIG. 1(b) is a cross-sectional view of the structure of the display device.
Figure 2:
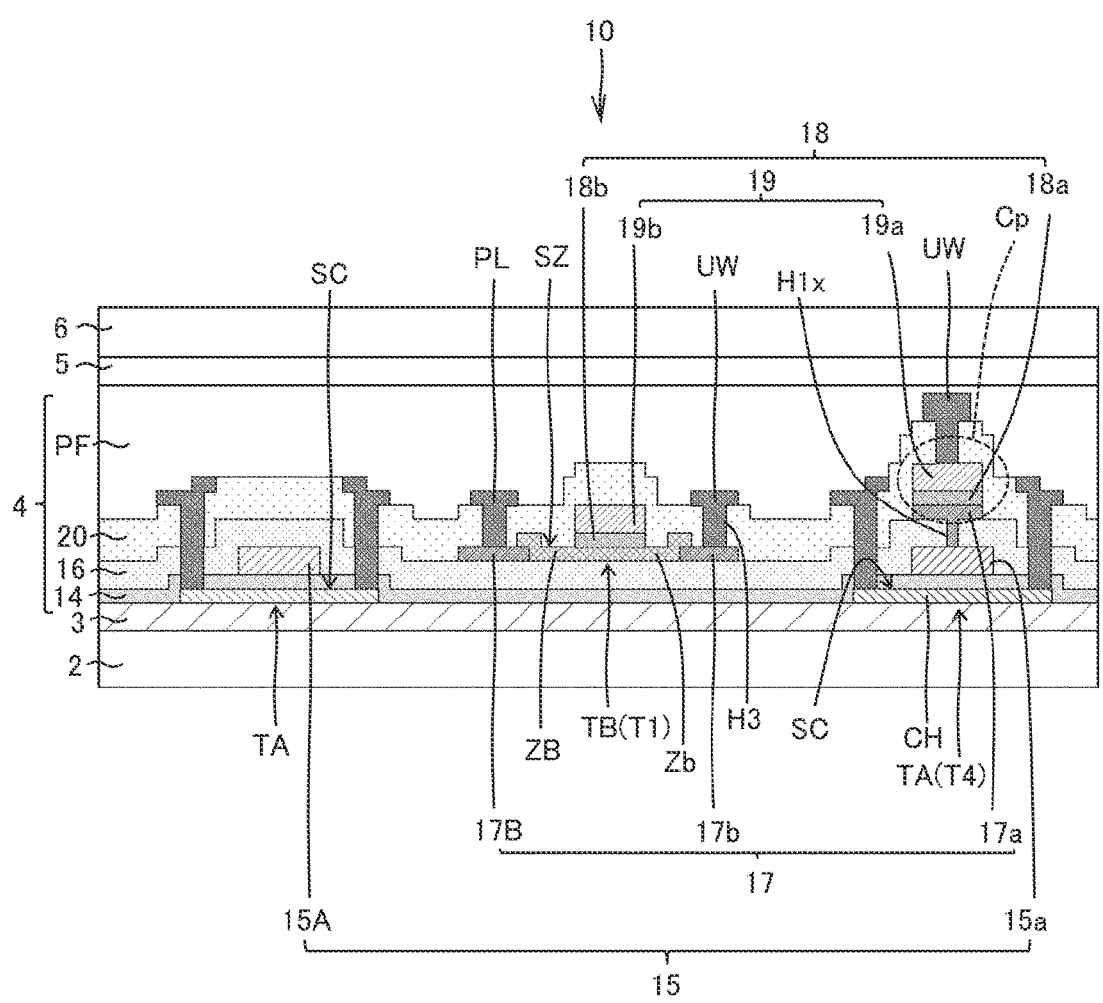
FIG. 2 is a cross-sectional view of the structure of the display device in accordance with the present embodiment.

Referring to FIG. 1, a display device 10 includes a thin-film-transistor substrate 7, a top-emission (emitting upward light) light-emitting element layer 5, and a sealing layer 6. For each subpixel SP are there provided a light-emitting element ED and a pixel circuit PC for the light-emitting element.

The thin-film-transistor substrate 7 includes a substrate 2, a base coating film 3, and a thin-film-transistor layer 4 in which the pixel circuits PC are formed. The substrate 2 is a glass substrate or a flexible base member composed primarily of a resin such as a polyimide. Alternatively, the substrate 2 may be made of two polyimide films and an inorganic film interposed between these polyimide films. The base coating film (barrier layer) 3 is an inorganic insulation layer for preventing the penetration of foreign materials such as water and oxygen and may be made using, for example, silicon nitride and/or silicon oxide.

The pixel circuits PC include: a plurality of first-structure transistors TA each including a crystalline silicon semiconductor film SC and first gate electrodes 15a, 15A; a plurality of second-structure transistors TB each including an oxide semiconductor film SZ and a second gate electrode 19b; and a capacitive element Cp connected to a drive transistor (T4) that is one of the first-structure transistors TA. The first-structure transistors TA and the second-structure transistors TB are of top-gate types, in which the control terminal (first gate electrodes 15a, 15A and second gate electrode 19b) is formed overlying the channel.

Referring to FIG. 2, the thin-film-transistor layer 4 contains: a crystalline silicon semiconductor layer SC on the base coating film 3; a first gate insulation film 14 covering the crystalline silicon semiconductor layer SC; the first gate electrodes 15A, 15a (first metal layer 15) overlying the first gate insulation film 14; a first interlayer insulation film 16 covering a first metal layer 15; a first capacitor electrode 17a and relay electrodes 17B, 17b (intermediate metal layer 17) overlying the first interlayer insulation film 16; the oxide semiconductor film SZ overlying the intermediate metal layer 17; a dielectric film 18a and a second gate insulation film 18b (intermediate insulation layer 18) overlying the oxide semiconductor film SZ; a second capacitor electrode 19a and the second gate electrode 19b (second metal layer 19) overlying the intermediate insulation layer 18; a second interlayer insulation film 20 covering the second metal layer 19; upper-layer wiring UW overlying the second interlayer insulation film 20 (third metal layer 21 in FIG. 1(b)); and a planarization film PF overlying the third metal layer 21.

The first gate insulation film 14 is disposed between the crystalline silicon semiconductor film SC and the first gate electrodes 15a, 15A. The second gate insulation film 18b is disposed between the oxide semiconductor film SZ and the second gate electrode 19b.

The crystalline silicon semiconductor film SC has: a portion thereof overlapping the first gate electrodes 15a, 15A, the overlapping portion serving as a semiconductor (channel); and a portion thereof not overlapping the first gate electrodes 15a, 15A, the non-overlapping portion being doped with an impurity or otherwise modified so as to serve as a conducting portion. The oxide semiconductor film SZ has: a portion thereof overlapping the second gate electrode 19b, the overlapping portion serving as a semiconductor (channel); and a portion thereof not overlapping the second gate electrode 19b, the non-overlapping, portion being subjected to reduction or otherwise modified so as to serve as a conducting portion.

The crystalline silicon semiconductor layer SC is made of, for example, a low-temperature polysilicon (LTPS). An oxide semiconductor film SZ contains, for example, at least one element selected from indium (In), gallium (Ga), tin (Sn), hafnium (Hf), zirconium (Zr), and zinc (Zn) and oxygen. Specifically, for example, an oxide semiconductor (InGaZnO) containing indium (In), gallium (Ga), zinc (Zn), and oxygen, an oxide semiconductor (InSnZnO) containing indium (In), tin (Sn), zinc (Zn), and oxygen, an oxide semiconductor (InZrZnO) containing indium (In), zirconium (Zr), zinc (Zn), and oxygen, or an oxide semiconductor (InHfZnO) containing indium (In), hafnium (Hf), zinc (Zn), and oxygen may be used.

The first metal layer 15, the intermediate metal layer 17, the second metal layer 19, and the third metal layer 21 are made of, for example, a metal monolayer film or metal multilayer film including at least one of aluminum, tungsten, molybdenum, tantalum, chromium, titanium, and copper.

The first gate insulation film 14 may be made of, for example, a silicon oxide (SiOx) film. The first interlayer insulation film 16, covering the first gate electrodes 15A, 15a, may be made of, for example, a stack of silicon oxide (SiOx) and silicon nitride (SiNx) films. The dielectric film 18a and the second gate insulation film 18b (intermediate insulation layer) may be made of, for example, a silicon oxide (SiOx) film. The second interlayer insulation film 20, covering the second gate electrode 19b, may be made of, a monolayer film of silicon oxide (SiOx) or a stack of silicon oxide (SiOx) and silicon nitride (SiNx) films. The planarization film PF may be made of, for example, an organic material, such as a polyimide or an acrylic resin, that can be provided by printing or coating technology.

The light-emitting element layer 5 in FIG. 1(b) contains: a lower electrode 22; an insulating, edge cover film 23 coveting an edge of the lower electrode 22; an EL (electroluminescence) layer 24 overlying the edge cover film 23; and an upper electrode 25 overlying the EL layer 24. The edge cover film 23 is formed by, for example, applying an organic material such as a polyimide or an acrylic resin and thereafter patterning the applied organic material through photolithography.

The light-emitting element layer 5 contains the light-emitting elements ED which emit light of different colors. Each light-emitting element includes the insular lower electrode 22, the EL layer 24 (including a light-emitting layer EK), and the upper electrode 25. The upper electrode 25 is a common electrode for the light-emitting elements ED.

The light-emitting elements ED may be, for example, OLEDs (organic light-emitting diodes) including an organic layer as a light-emitting layer or may be QLEDs (quantum-dot light-emitting diodes) including a quantum-dot layer as a light-emitting layer.

The EL layer 24 is formed by, for example, stacking a hole injection layer, a hole transport layer, the light-emitting layer EK, an electron transport layer, and an electron injection layer in this order when viewed from below. The light-emitting layer is formed in an insular manner in an opening of the edge cover film 23 (for each subpixel) by vapor deposition, inkjet printing, or photolithography. The other layers are formed either in an insular manner or as common layers. In addition, any one or more of the hole injection layer, the hole transport layer, the electron transport layer, and the electron injection layer may be omitted.

The lower electrode 22 (anode) includes, for example, a stack of ITO (indium tin oxide) and Ag (silver) or a Ag-containing alloy and is reflective to light. The upper electrode 25 (cathode) includes, for example, a thin film of a metal such as a magnesium-silver alloy and is transmissive to light.

When the light-emitting elements ED are OLEDs, holes and electrons recombine in the light-emitting layer EK due to a drive current between the lower electrode 22 and the upper electrode 25, to produce excitons that transition to the ground state to emit light. When the light-emitting elements ED are QLEDs, holes and electrons recombine in the light-emitting layer EK due to a drive current between the lower electrode 22 and the upper electrode 25, to produce excitons that transition from the conduction band to the valence band of the quantum dots to emit light.

In FIG. 1(b), the sealing layer 6, covering the light-emitting element layer 5, prevents the permeation of foreign materials such as water and oxygen into the light-emitting element layer 5 and includes, for example, two inorganic sealing films 26, 28 and an organic film 27 provided between these inorganic sealing films.

Figure 3:
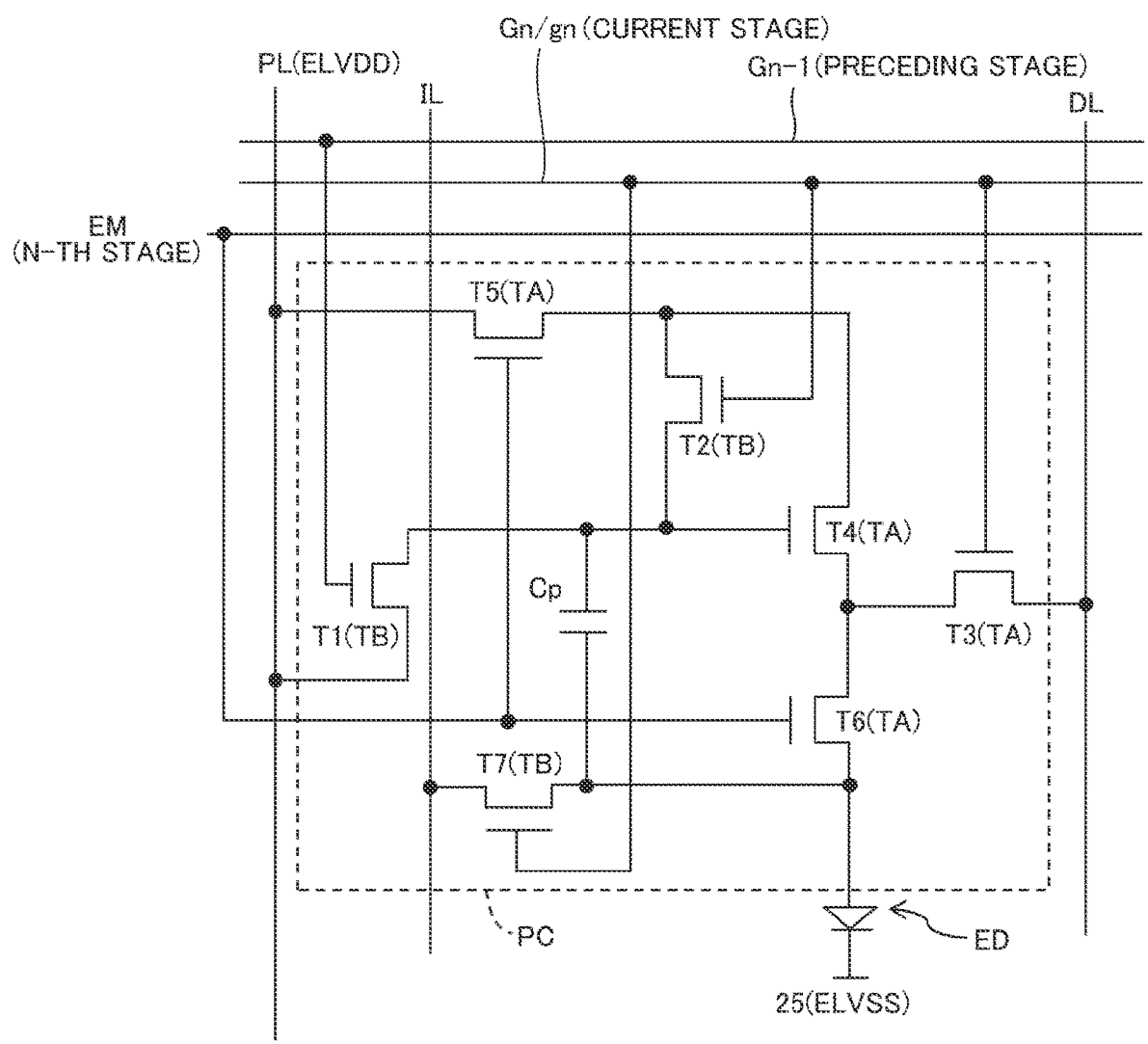
FIG. 3 is a circuit diagram of an exemplary pixel circuit.

FIG. 3 is a circuit diagram of an exemplary pixel circuit. The pixel circuit PC in FIG. 3 includes: the capacitive element Cp; a resetting transistor T1 having a control terminal thereof connected to a scan signal line Gn-1 of a preceding stage ((n−1)-th stage); a threshold value control transistor T2 having a control terminal thereof connected to a scan signal line Gn of the current stage (n-th stage); a write control transistor T3 having a control terminal thereof connected to the scan signal line Gn of the current stage (n-th stage); the drive transistor T4 for controlling current for the light-emitting element ED; a power supply transistor T5 having a control terminal thereof connected to a light-emission control line EM (n-th stage); a light-emission control transistor T6 having a control terminal thereof connected to the light-emission control line EM (n-th stage); and an initialization transistor T7 having a control terminal thereof connected to the scan signal line Gn of the current stage (n-th stage).

The write control transistor T3, the drive transistor T4, the power supply transistor T5, and the light-emission control transistor T6 are first-structure transistors (TA) and include the crystalline silicon semiconductor film SC (see FIG. 2). The resetting transistor T1, the threshold value control transistor T2, and the initialization transistor T7 are second-structure transistors (TB) and include the oxide semiconductor film SZ (see FIG. 2).

The drive transistor T4 has a control terminal thereof connected to the anode of the light-emitting element ED via the capacitive element Cp and also to a power supply line PL via the resetting transistor T1. The power supply line PL is fed with a high-voltage power supply ELVDD.

The drive transistor T4 has a source region thereof connected to a data signal line DL via the write control transistor T3 and also to the anode (lower electrode 22) of the light-emitting element ED via the light-emission control transistor T6. The drive transistor T4 has a drain region thereof connected to the control terminal of the drive transistor T4 via the threshold value control transistor T2 and also to the power supply line PL via the power supply transistor T5.

The anode of the light-emitting element ED is connected to an initialization signal line IL via the initialization transistor T7. The initialization signal line IL and the cathode (upper electrode 25) of the light-emitting element ED are fed commonly with, for example, the low-voltage power supply (ELVSS).

Figure 4:
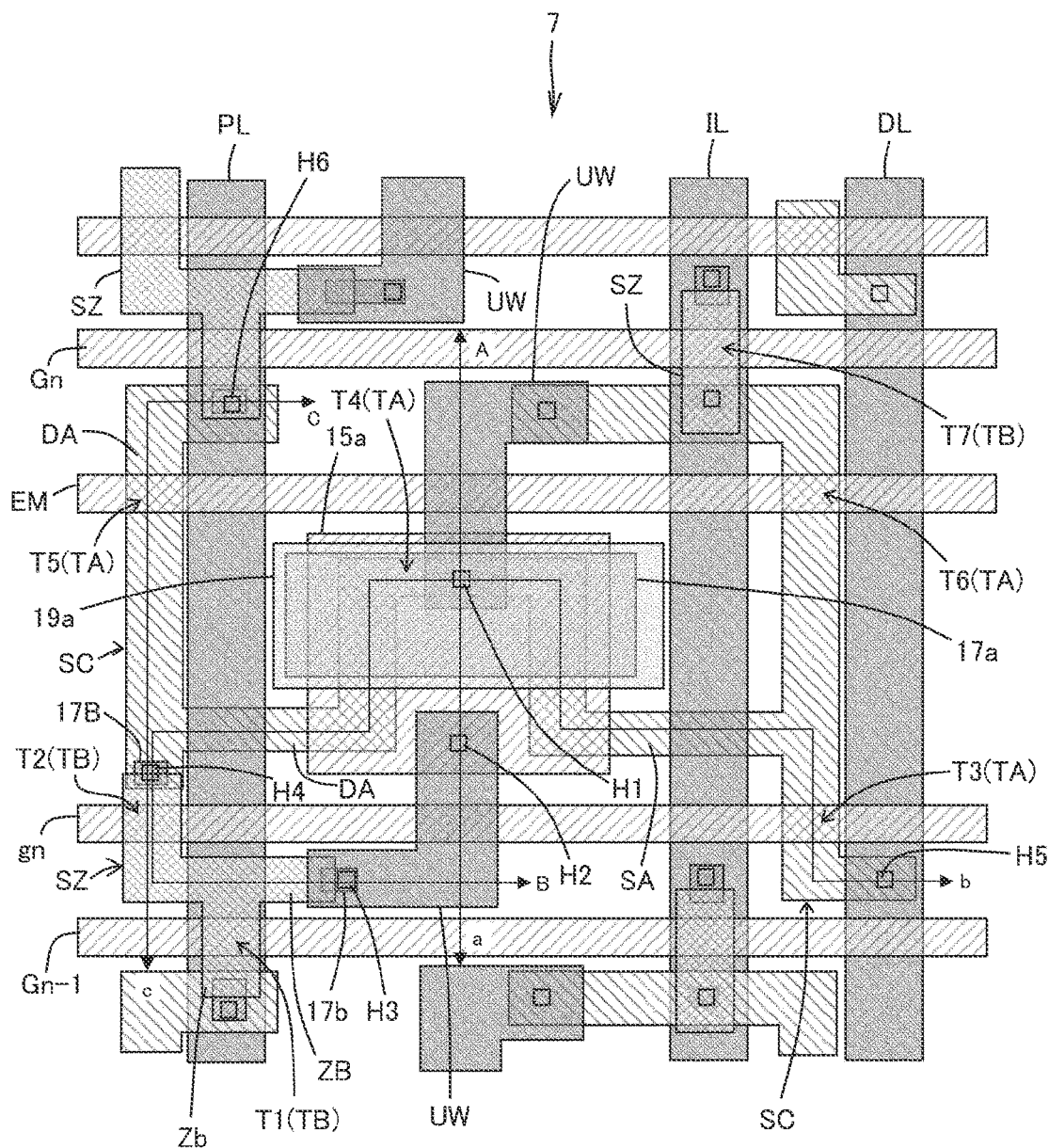
FIG. 4 is a plan view of an exemplary structure of a thin-film-transistor substrate containing a pixel circuit.

FIG. 4 is a plan view of an exemplary structure of a thin-film-transistor substrate containing a pixel circuit. FIG. 5(a) is an A-a cross-sectional view of FIG. 4, FIG. 5(b) is a B-b cross-sectional view of FIG. 4, and FIG. 5(c) is a C-c cross-sectional view of FIG. 4.

The pixel circuit PC is provided with: a pair of scan signal lines Gn, gn for the current stage; the light-emission control line EM; the data signal line DL; the initialization signal line IL; and a high-voltage power supply line PL. Each of the scan signal lines Gn, gn has a double-layer structure of lower wiring contained in the first metal layer 15 and upper wiring contained in the second metal layer 19. The light-emission control line EM is contained in the first metal layer 15. The data signal line DL, the initialization signal line IL, and the power supply line PL are contained in the third metal layer 21.

The write control transistor T3, the power supply transistor T5, and the light-emission control transistor T6 are first-structure transistors (TA) and include the first gate electrode 15A (see FIG. 2) serving as a control terminal. The first gate electrode 15A is a part of the lower wiring, of the scan signal line gn or a part of the light-emission control line EM.

The resetting transistor T1, the threshold value control transistor T2, and the initialization transistor T7 are second-structure transistors (TB) and include the second gate electrode 19b (see FIG. 2) serving as a control terminal. The second gate electrode 19b is a part of the upper wiring of the scan signal line Gn-1, a part of the upper wiring of the scan signal line gn, or a part of the upper wiring of the scan signal line Gn.

Figure 5:
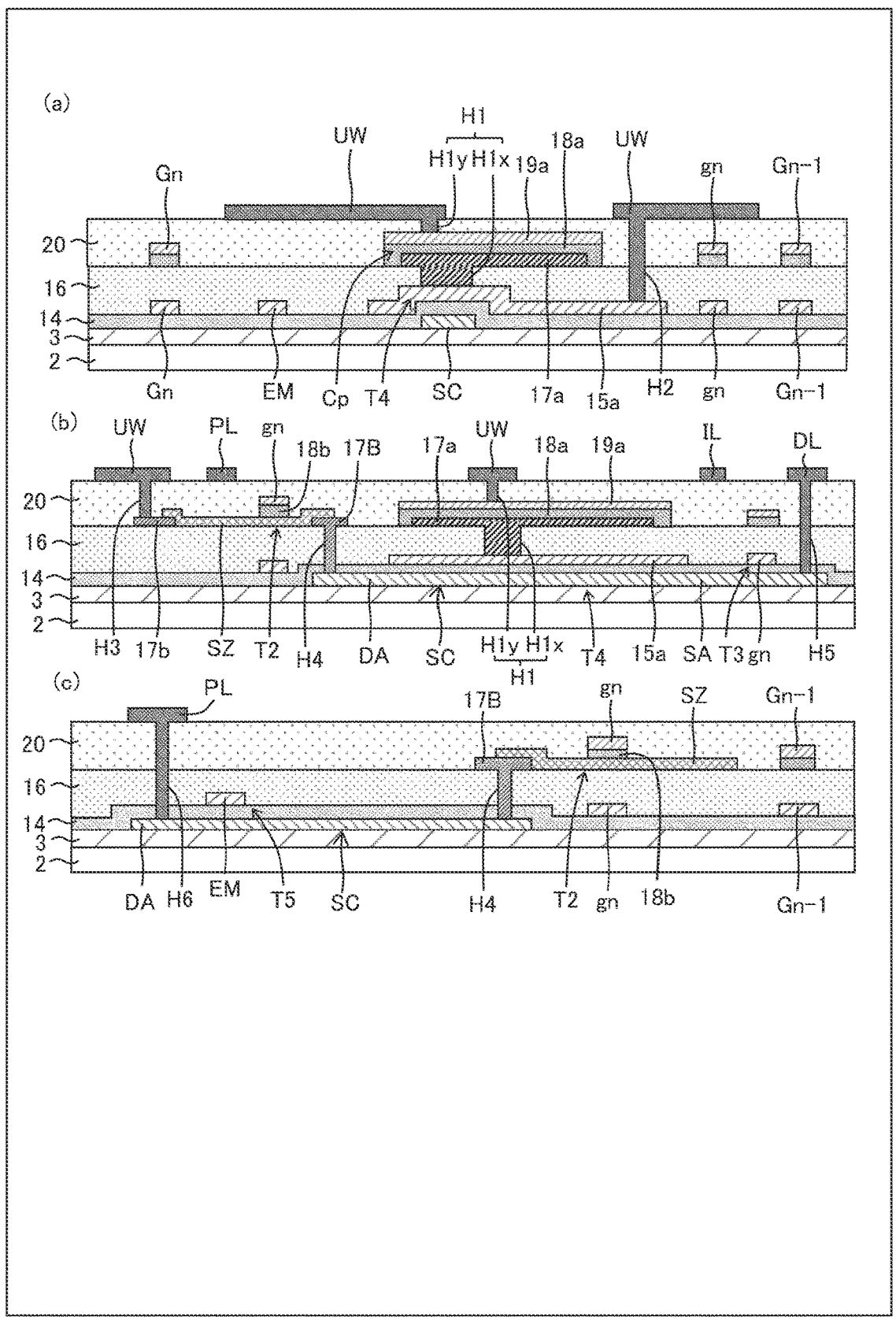
FIG. 5(a) is an A-a cross-sectional view of FIG. 4.
FIG. 5(b) is a B-b cross-sectional view of FIG. 4.
FIG. 5(c) is a C-c cross-sectional view of FIG. 4.

Referring to FIGS. 2 and 5, the drive transistor T4 is a first-structure transistor (TA). The capacitive element Cp includes: the first capacitor electrode 17a electrically connected to the first gate electrode 15a of the drive transistor T4; the second capacitor electrode 19a opposite the first capacitor electrode 17a; and the dielectric film 18a between the first capacitor electrode 17a and the second capacitor electrode 19a. The dielectric film 18a is disposed in a different layer than are the first interlayer insulation film 16 and the second interlayer insulation film 20 (disposed in the intermediate insulation layer 18 containing the second gate insulation film 18b).

Therefore, the dielectric film 18a can be formed thinner than the first interlayer insulation film 16 and the second interlayer insulation film 20 by using, for example, silicon oxide, which facilitates optimization of the capacitance of the capacitive element Cp. Additionally, a material that can be a good hydrogen supply source to the crystalline silicon semiconductor film SC (e.g., silicon nitride) may be used in the first interlayer insulation film 16, and a material that is suited to the oxide semiconductor film SZ (e.g., silicon oxide) may be used in the second interlayer insulation film 20.

Since the dielectric film 18a is made of the same material and in the same layer as the second gate insulation film 18b, the first capacitor electrode 17a is contained in the intermediate metal layer 17, and the second capacitor electrode 19a is contained in the second metal layer 19, the foregoing effects are achieved without additional manufacturing steps.

The second gate insulation film 18b is formed in an insular manner to match the second gate electrode 19b, and the dielectric film 18a is formed in an insular manner to match the second capacitor electrode 19a.

The first gate electrode 15a of the drive transistor T4 and the first capacitor electrode 17a are connected via a contact hole Rix in the first interlayer insulation film 16. Since the capacitive element Cp is formed overlapping the channel CH of the drive transistor T4 in a plan view; the pixel circuit PC can be reduced in size.

Referring to FIGS. 2 to 5, the oxide semiconductor film SZ includes, at the ends of the channel thereof, two conducting portions ZB, Zb that are modified into a conductor. The intermediate metal layer 17 contains the relay electrode 17B in contact with the conducting portion LB and the relay electrode 17b in contact with the conducting portion Zb. For instance, the relay electrode 17b is connected to the upper-layer wiring UW (third metal layer 21) via a contact hole H3 in the second interlayer insulation film 20, and the relay electrode 17B is connected to the power supply line PL (third metal layer 21) via a contact hole in the second interlayer insulation film 20.

The first capacitor electrode 17a is connected to the power supply line PL via the resetting transistor T1 that is a second-structure transistor (TB). The second capacitor electrode 19a is connected to the initialization signal line IL via the initialization transistor T7 that is a second-structure transistor (TB).

In the drive transistor T4, the crystalline silicon semiconductor film SC, located at both ends of the channel, includes a source region SA and a drain region DA that are modified into a conductor. The source region SA is connected to the data signal line DL via a write transistor T3 that is a first-structure transistor (TA) and also to the anode of the light-emitting element ED via the light-emission control transistor T6 that is a first-structure transistor (TA). The drain region DA is connected to the power supply line PL via the power supply transistor T5 that is a first-structure transistor (TA) and also to the first gate electrode 15a of the drive transistor T4 via the threshold value control transistor T2 that is a second-structure transistor (TB).

Note that as shown in FIGS. 4 and 5, the second capacitor electrode 19a is connected to the upper-layer wiring UW via a contact hole H1y in the second interlayer insulation film 20 (in FIG. 4, the contact hole and the contact hole H1y are collectively denoted by H1). The first gate electrode 15a of the drive transistor T4 is connected to the upper-layer wiring UW via a contact hole H2 in the first interlayer insulation film 16 and the second interlayer insulation film 20.

The relay electrode 17b in contact with an end (conducting portion) of the oxide semiconductor film SZ of the threshold value control transistor T2 is connected to the upper-layer wiring UW via the contact hole H3 in the second interlayer insulation film 20. The relay electrode 17B in contact with the other end (conducting portion) thereof is connected to the drain region DA of the crystalline silicon semiconductor film SC of the drive transistor T4 via a contact hole H4 in the first interlayer insulation film 16 and the first gate insulation film 14. The source region SA of the crystalline silicon semiconductor film SC of the transistor T4 is connected to the data signal line DL via the write control transistor T3 and also via a contact hole H5 in the second interlayer insulation film 20, the first interlayer insulation film 16, and the first gate insulation film 14.

The drain region DA of the crystalline silicon semiconductor film SC of the power supply transistor T5 is connected to the power supply line PL via a contact hole H6 in the second interlayer insulation film 20, the first interlayer insulation film 16, and the first gate insulation film 14.

Figure 6:
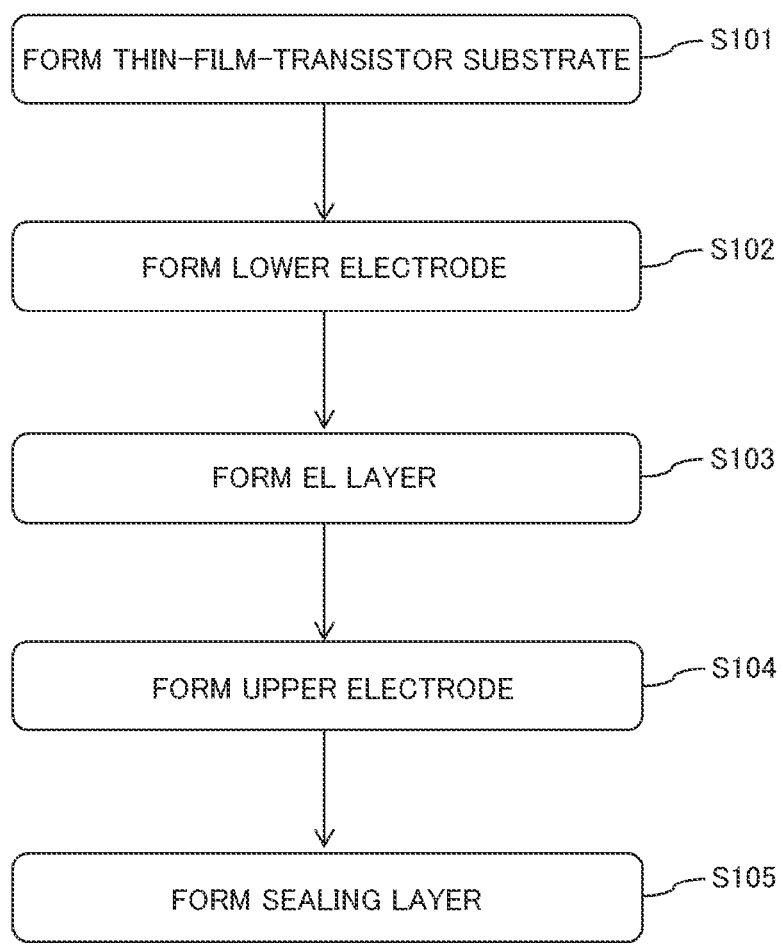
FIG. 6 is a flow chart representing a method of manufacturing the display device in accordance with the present embodiment.

FIG. 6 is a flow chart representing a method of manufacturing a display device in accordance with the present embodiment. Referring to FIGS. 1 and 6, in step S101, the thin-film-transistor substrate 7 is formed. In step S102, the lower electrode 22 is formed. In step S103, the EL layer 24 is formed. In step S104, the upper electrode 25 is formed. In step S105, the sealing layer 6 is formed.

Figure 7:
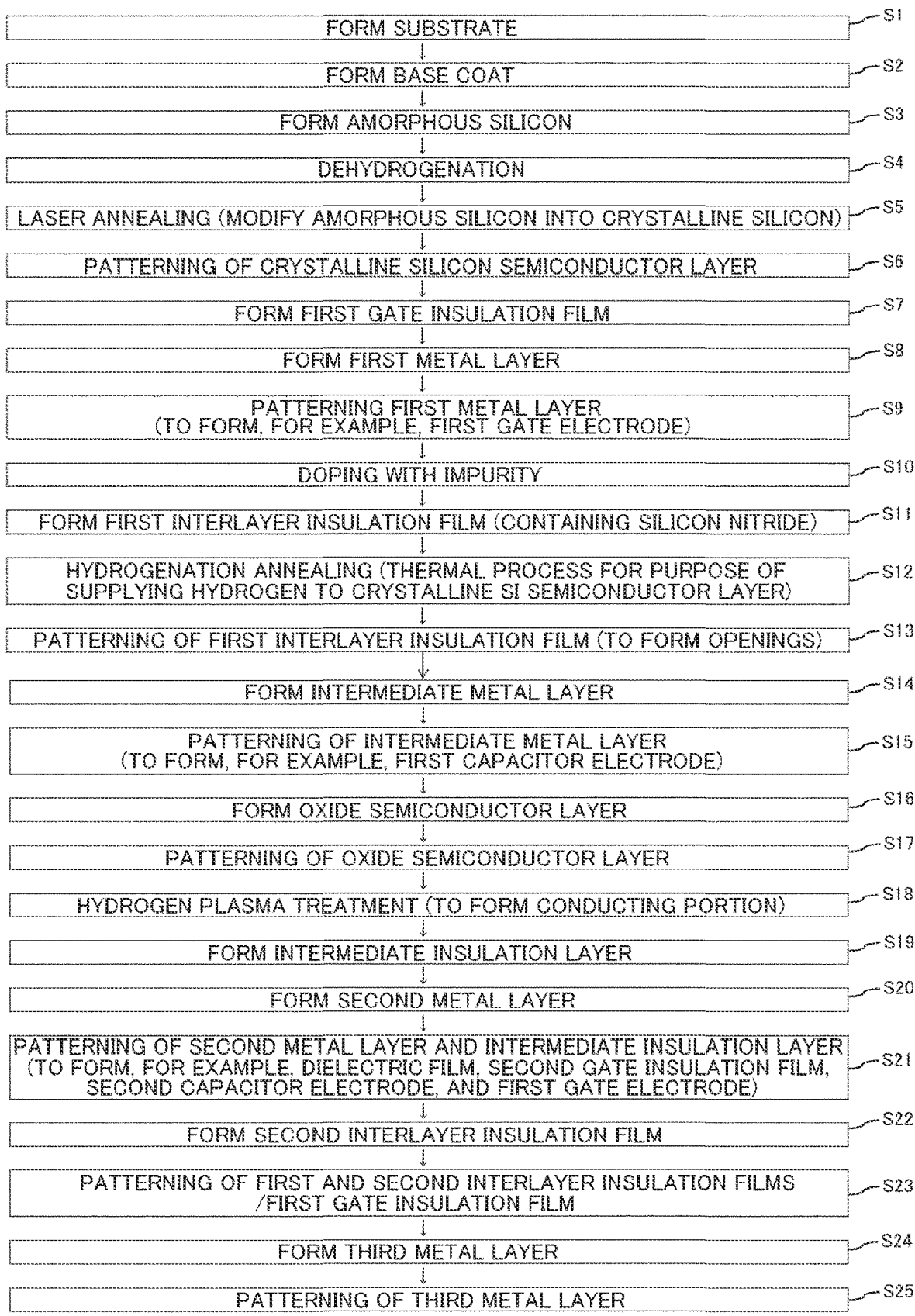
FIG. 7 is a flow chart representing a method of forming the thin-film-transistor substrate shown in FIG. 6.

FIG. 7 is a flow chart representing a method of forming the thin-film-transistor substrate shown in FIG. 6. FIGS. 8 to 14 are cross-sectional views illustrating a method of forming the thin-film-transistor substrate. Legends (a) to (c) in FIGS. 8 to 14 correspond to (a) to (c) in FIG. 5.

Figure 8:
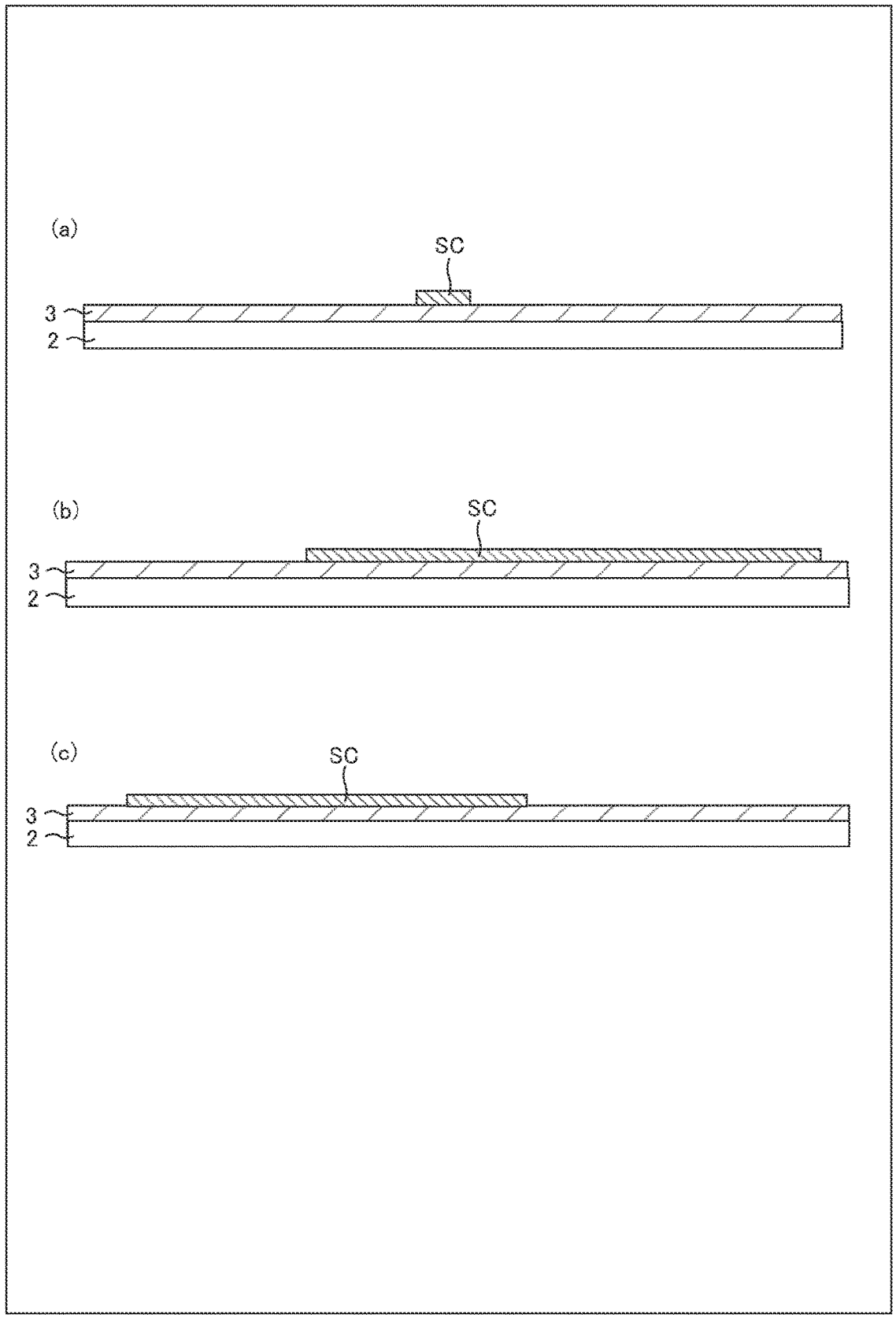
FIG. 8 is a cross-sectional view illustrating a method of forming a thin-film-transistor substrate in accordance with the present embodiment.

Referring to FIGS. 7 and 8, in step S1, the substrate 2 is formed. In step S2, the base coating film 3 is formed. In step S3, a film of amorphous silicon is formed. In step S4, the amorphous silicon is dehydrogenated in a thermal process. In step S5, the amorphous silicon is crystalized (polysilicon) by ELA (Excimer Laser Annealing), to form the crystalline silicon semiconductor layer SC. In step S6, the crystalline silicon semiconductor layer SC is patterned by photolithography.

Figure 9:
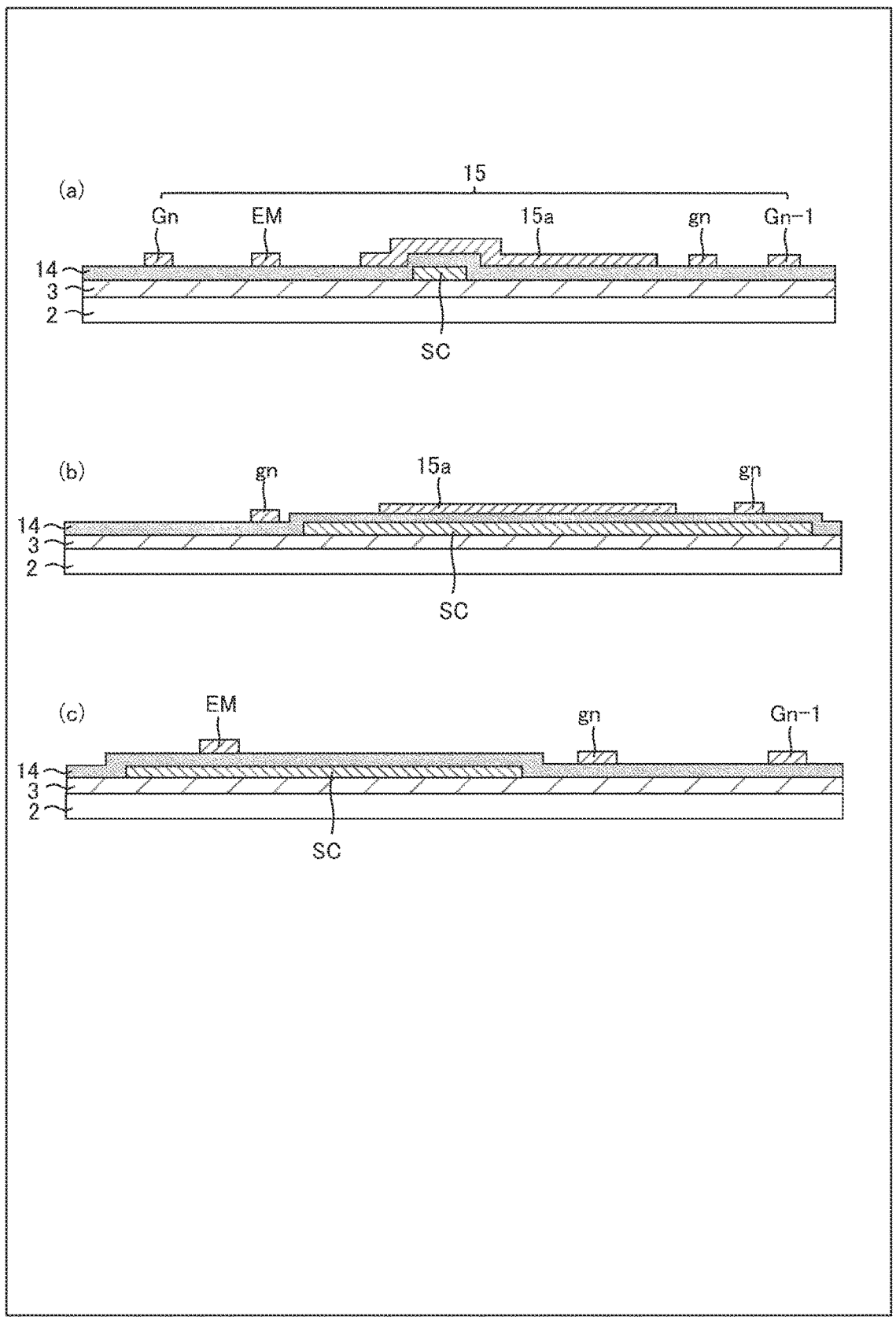
FIG. 9 is a cross-sectional view illustrating the method of forming the thin-film-transistor substrate in accordance with the present embodiment.

Referring to FIGS. 7 and 9, in step S7, the first gate insulation film 14 (e.g., silicon oxide) is formed by CVD. In step S8, the first metal layer 15 (molybdenum or a molybdenum-based alloy such as MoW) is formed by sputtering. In step S9, the first metal layer 15 is patterned by photolithography (to form, for example, the lower wiring of the scan signal line, the light-emission control line EM, and the first gate electrodes 15a). In step S10, the crystalline silicon semiconductor layer SC is doped with an impurity (to modify the layer SC into a conductor).

Figure 10:
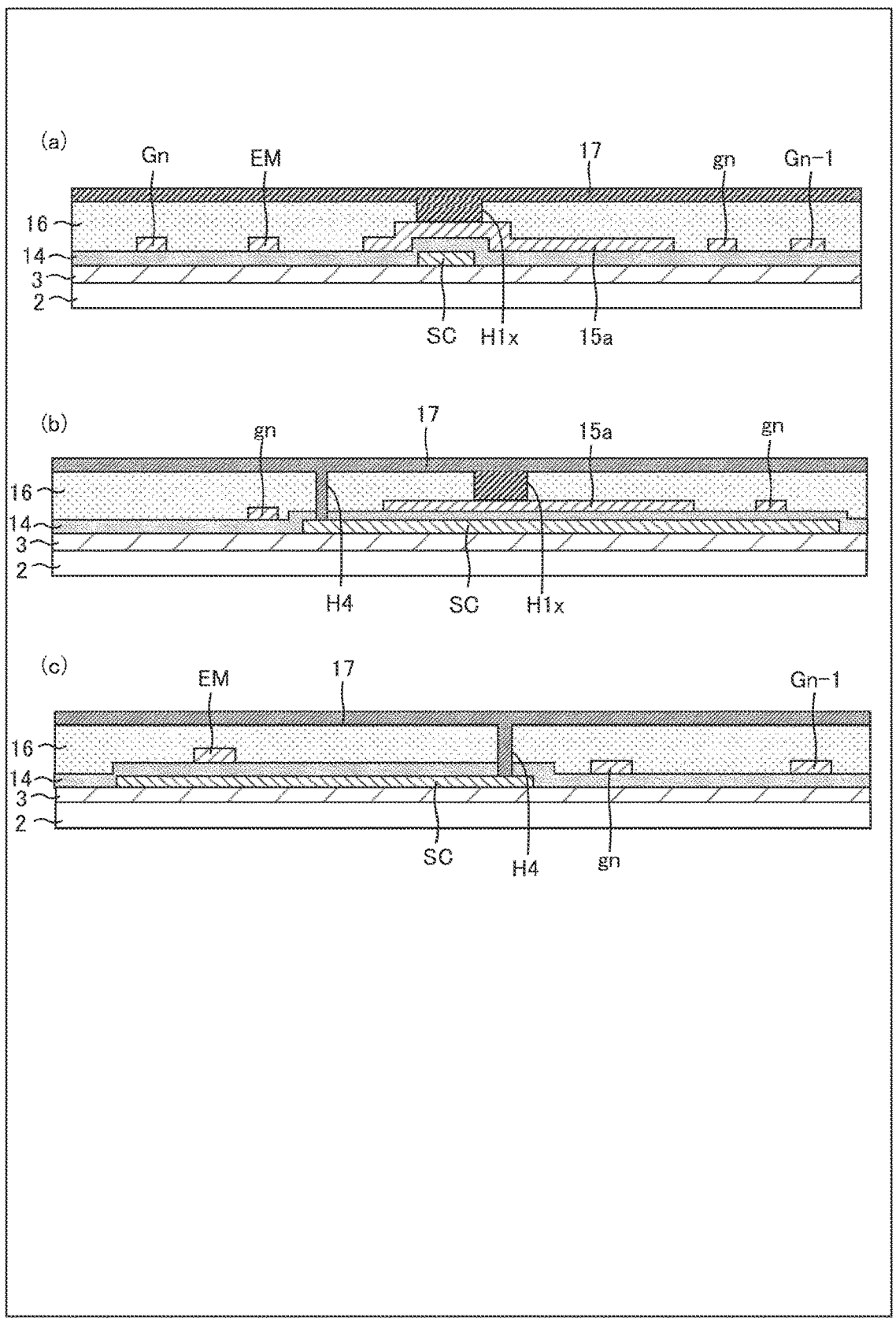
FIG. 10 is a cross-sectional view illustrating the method of forming the thin-film-transistor substrate in accordance with the present embodiment.

Referring to FIGS. 7 and 10, in step S11, the first interlayer insulation film 16 (e.g., a stack of silicon oxide and silicon nitride films) is formed by CVD. In step S12, hydrogenation annealing (thermal process for the purpose of supplying hydrogen to the crystalline silicon semiconductor layer SC) is performed. Adverse effects of defects in the crystalline silicon semiconductor layer SC are hence reduced. In step S13, the first interlayer insulation film 16 is patterned by photolithography (to form, for example, the contact holes 114, H1x). In step S14, the intermediate metal layer 17 (molybdenum or a molybdenum-based alloy such as MoW) is formed.

Figure 11:
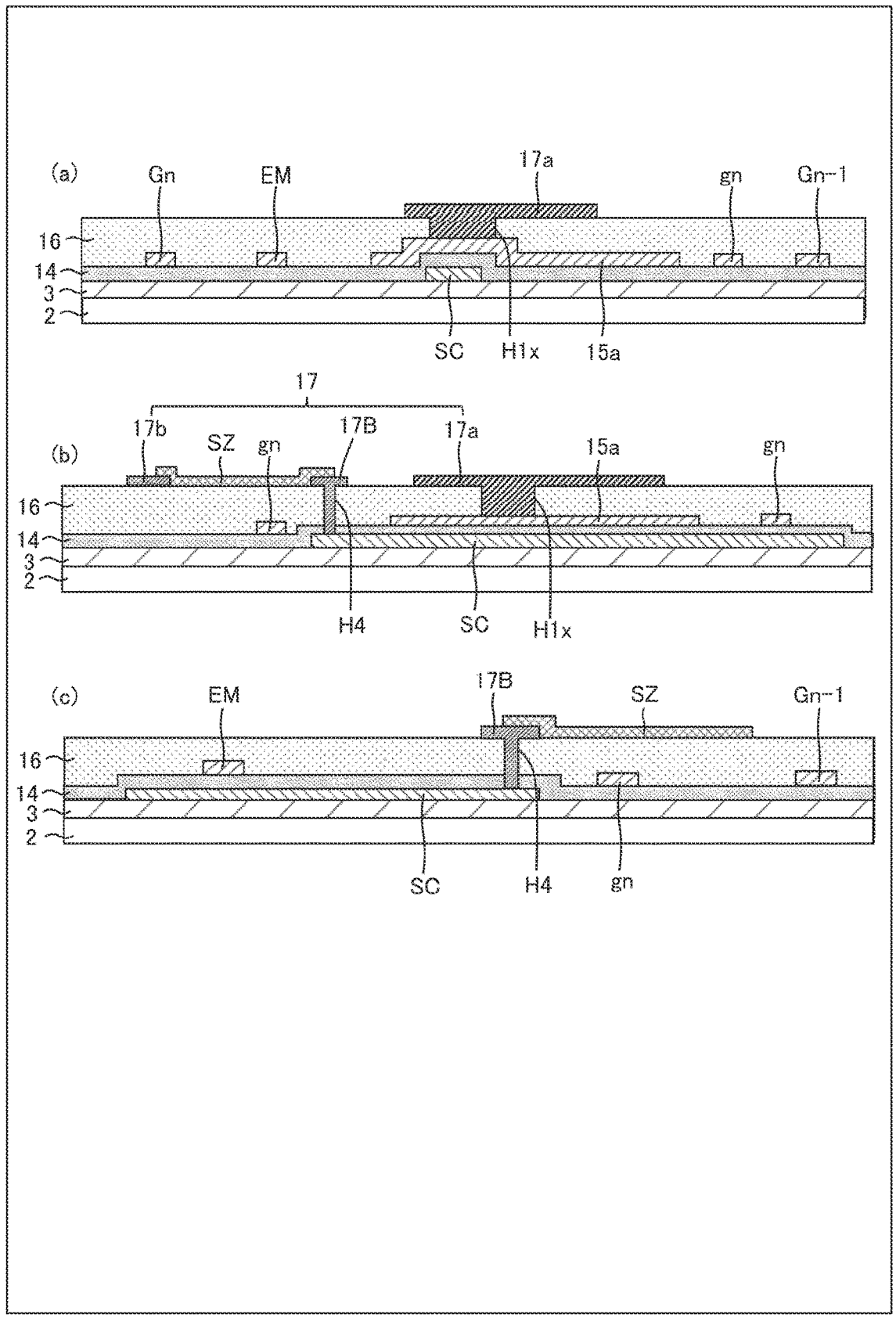
FIG. 11 is a cross-sectional view illustrating the method of forming the thin-film-transistor substrate in accordance with the present embodiment.

Referring to FIGS. 7 and 11, in step S15, the intermediate metal layer 17 is patterned by photolithography (to form, for example, the first capacitor electrode 17a and the relay electrodes 17B, 17b). In step S16, the oxide semiconductor film SZ is formed by sputtering. In step S17, the oxide semiconductor film SZ is patterned. In this method, a technique by which the oxide semiconductor film SZ is only etched without etching the intermediate metal layer 17 (e.g., a wet etching process using oxalic acid and/or hydrofluoric acid) is used.

Figure 12:
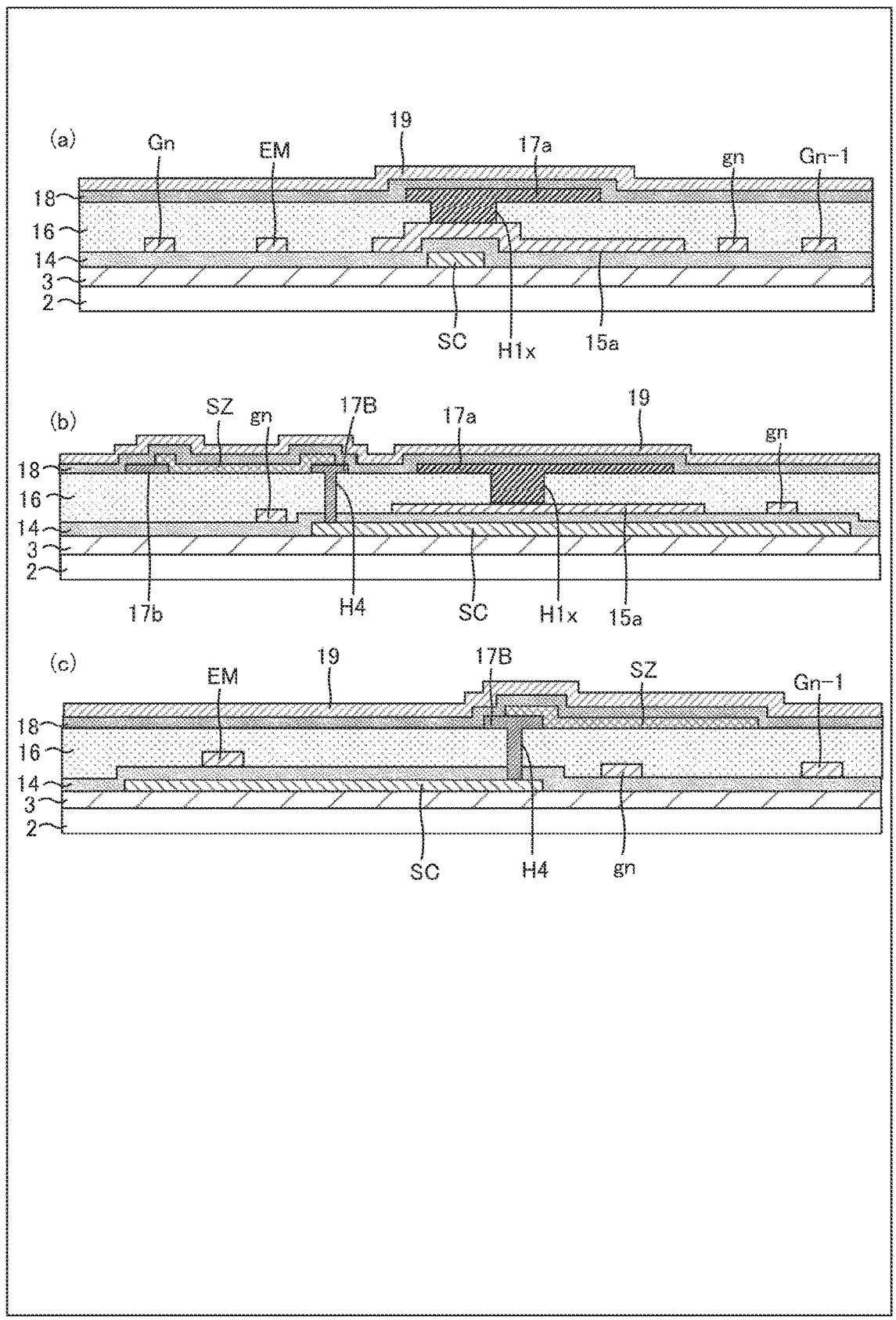
FIG. 12 is a cross-sectional view illustrating the method of forming the thin-film-transistor substrate in accordance with the present embodiment.

Referring to FIGS. 7 and 12, in step S18, the regions that are not covered with the second gate electrode 19b and the second gate insulation film 18b are subjected to a hydrogen plasma treatment (to form conducting portions in the oxide semiconductor layer SZ). In step S19, the intermediate insulation layer 18 (e.g., silicon oxide) is formed by CVD. In step S20, the second metal layer 19 (e.g., a stack of titanium/aluminum/titanium films) is formed by sputtering.

Figure 13:
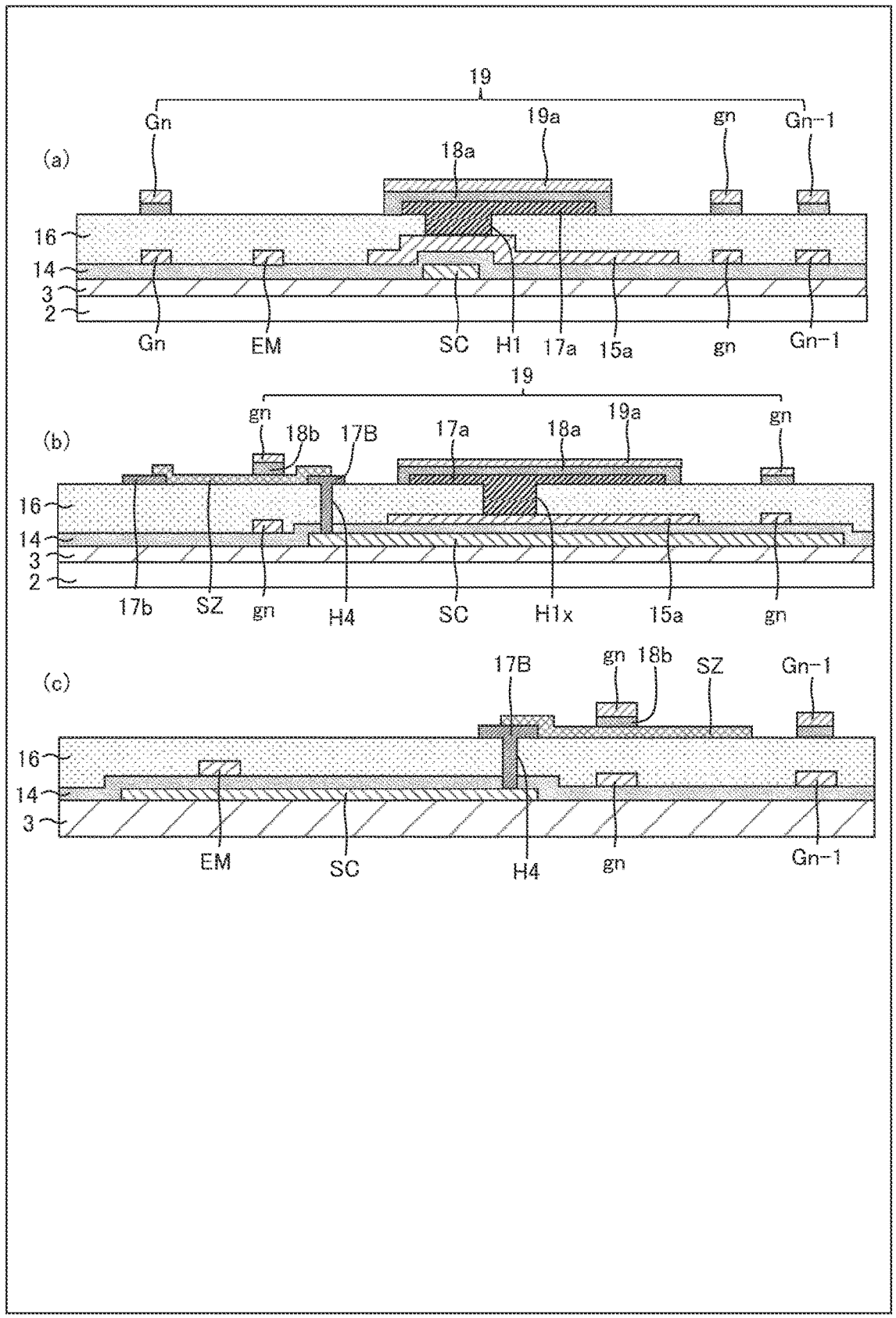
FIG. 13 is a cross-sectional view illustrating the method of forming the thin-film-transistor substrate in accordance with the present embodiment.

Referring to FIGS. 7 and 13, in step S21, the second metal layer 19 and the intermediate insulation layer 18 are patterned by photolithography (to form, for example, the dielectric film 18a, the second gate insulation film 18b, the second capacitor electrode 19a, and the second gate electrode 19b). In step S21, the patterning of the second metal layer 19 and the patterning of the intermediate insulation layer 18 are performed successively using the same mask.

Figure 14:
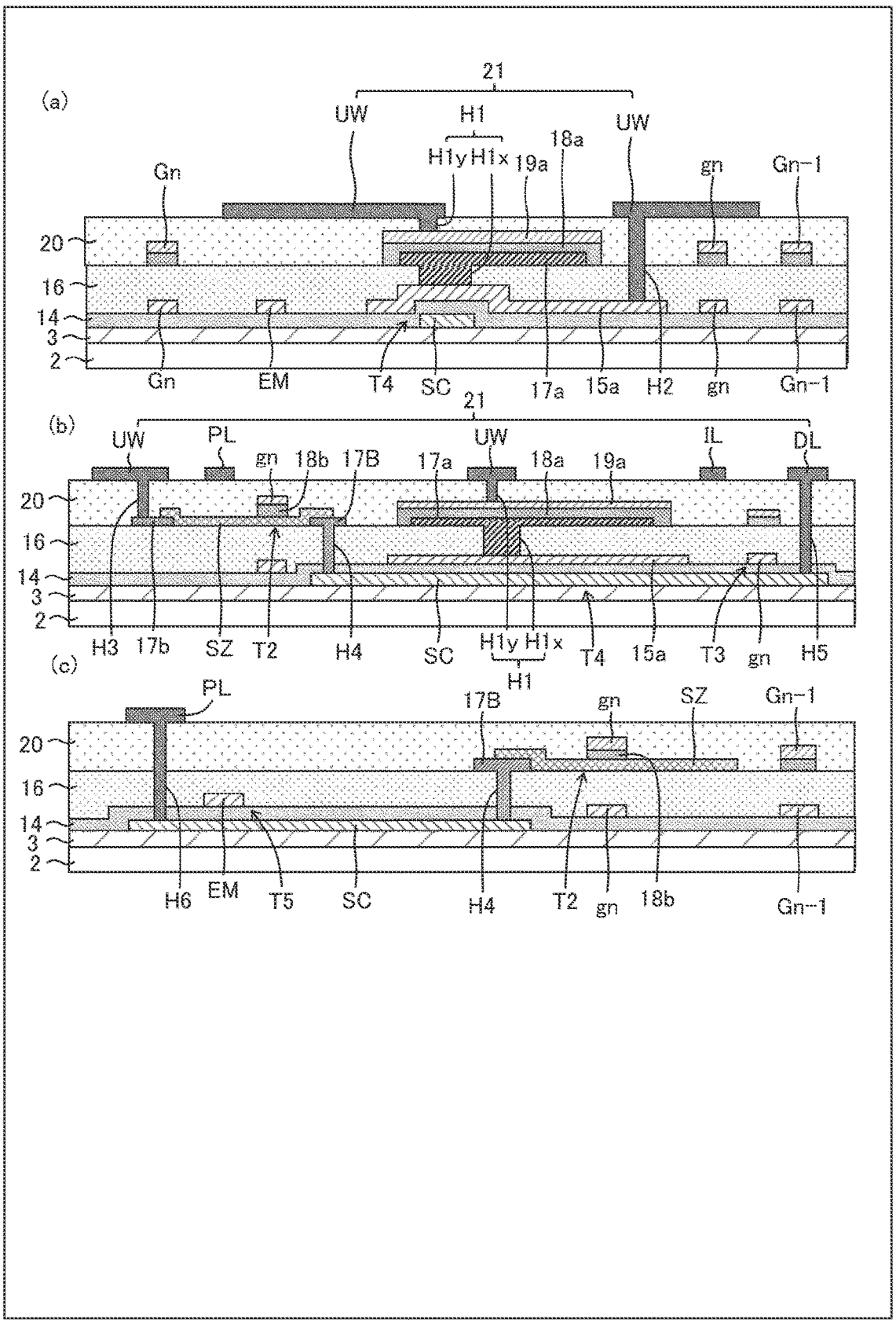
FIG. 14 is a cross-sectional view illustrating the method of forming the thin-film-transistor substrate in accordance with the present embodiment.

Referring to FIGS. 7 and 14, in step S22, the second interlayer insulation film 20 (e.g., silicon oxide monolayer film or a stack of silicon nitride and silicon oxide films) is formed using by CVD. In step S23, the first interlayer insulation film 16, the second interlayer insulation film 20, and the first gate insulation film 14 are patterned by photolithography (to form in the contact holes H1y, H2, H3, H5, H6). In step S24, the third metal layer 21 (e.g., a stack of titanium/aluminum/titanium films) is formed by sputtering. In step S25, the third metal layer 21 is patterned by photolithography (to form the upper-layer wiring UW, the data signal line DL, the initialization signal line IL, and the power supply line PL).

Figure 15:
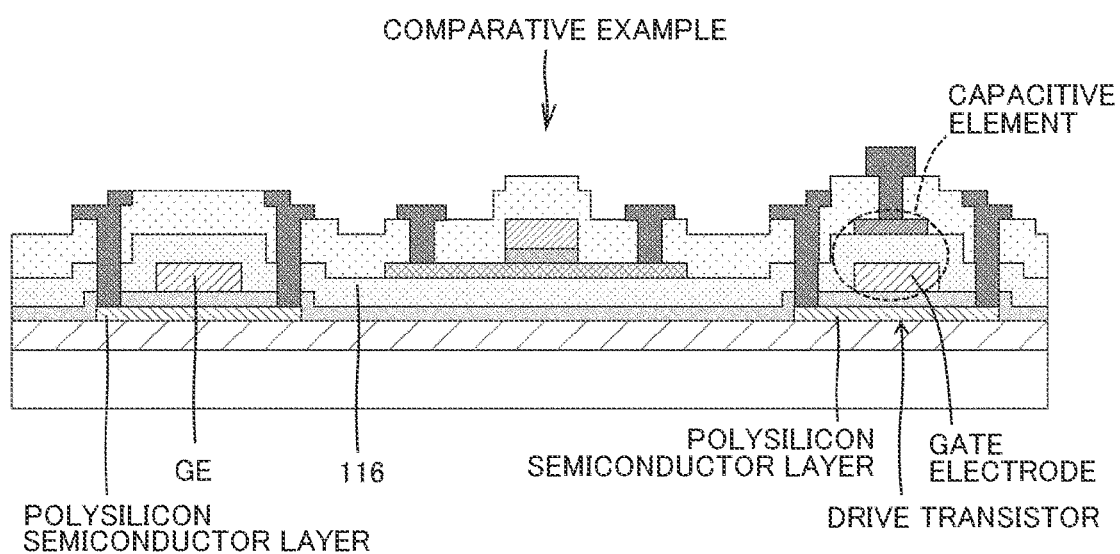
FIG. 15 is a cross-sectional view of a structure of a thin-film-transistor substrate in accordance with a comparative example.

FIG. 15 is a cross-sectional view of a structure of a thin-film-transistor substrate in accordance with a comparative example. If an inorganic insulation film 116 covering a gate electrode GE is used as a dielectric film of a capacitive element connected to a drive transistor as shown in FIG. 15, the inorganic insulation film 116 needs to function as both a hydrogenation supply source to the polysilicon semiconductor layer and a dielectric film. This double function is difficult to achieve.

The embodiments and examples described so far are for illustrative purposes only and by no means limit the scope of the disclosure. It is obvious to the person skilled in the art that many modifications and variations are possible based on the description.

General Description

Aspect 1

A display device including a pixel circuit and a light-emitting, element, the pixel circuit including: a transistor with a first structure including a crystalline silicon semiconductor film and a first gate electrode; and a transistor with a second structure including an oxide semiconductor film and a second gate electrode, the display device further including: a first interlayer insulation film covering the first gate electrode; and a second interlayer insulation film covering the second gate electrode, wherein the pixel circuit includes: a drive transistor that has the first structure; and a capacitive element, the capacitive element includes: a first capacitor electrode electrically connected to a first gate electrode of the drive transistor; a second capacitor electrode opposite the first capacitor electrode; and a dielectric film between the first capacitor electrode and the second capacitor electrode, and the dielectric film is disposed in a different layer than are the first interlayer insulation film and the second interlayer insulation film.

Aspect 2

The display device of, for example, aspect 1 further including: a first gate insulation film between the crystalline silicon semiconductor film and the first gate electrode; and a second gate insulation film between the oxide semiconductor film and the second gate electrode, wherein the dielectric film is made of a same material and in a same layer as the second gate insulation film.

Aspect 3

The display device of, for example, aspect 1 or 2, wherein the capacitive element overlaps a channel of the drive transistor in a plan view.

Aspect 4

The display device of, for example, aspect 2, wherein the dielectric film and the second gate insulation film are formed in an independently insular manner.

Aspect 5

The display device of, for example, any one of aspects 1 to 4, wherein the oxide semiconductor film is formed overlying the crystalline silicon semiconductor film, and the transistor with the first structure and the transistor with the second structure are of top-gate types.

Aspect 6

The display device of, for example, aspect 5 further including: a first metal layer containing the first gate electrode; a second metal layer containing the second gate electrode; a third metal layer disposed overlying the second interlayer insulation film; and an intermediate metal layer disposed overlying the first interlayer insulation film and underlying the oxide semiconductor film, wherein the first capacitor electrode is contained in the intermediate metal layer.

Aspect 7

The display device of, for example, aspect 6, wherein the second capacitor electrode is contained in the second metal layer.

Aspect 8

The display device of, for example, aspect 6, wherein the first gate electrode of the drive transistor and the first capacitor electrode are connected via a contact hole formed in the first interlayer insulation film.

Aspect 9

The display device of, for example, aspect 6, wherein the oxide semiconductor film includes a conducting portion that is modified into a conductor, a relay electrode is provided in contact with the conducting portion, and the relay electrode is contained in the intermediate metal layer.

Aspect 10

The display device of, for example, any one of aspects 1 to 9, wherein the dielectric film contains silicon oxide.

Aspect 11

The display device of, for example, any one of aspects 1 to 10, wherein the first interlayer insulation film contains silicon nitride, and the second interlayer insulation film contains silicon oxide.

Aspect 12

The display device of, for example, any one of aspects 1 to 11, wherein the first capacitor electrode is connected to a power supply line via a resetting transistor that has the second structure.

Aspect 13

The display device of, for example, any one of aspects 1 to 12, wherein the second capacitor electrode is connected to an initialization signal line via an initialization transistor that has the second structure.

Aspect 14

The display device of, for example, any one of aspects 1 to 12, wherein the crystalline silicon semiconductor film of the drive transistor includes a source region and a drain region at both ends of the channel.

Aspect 15

The display device of, for example, aspect 14, wherein one of the source region and the drain region is connected to a data signal line via a write transistor that has the first structure.

Aspect 16

The display device of, for example, aspect 14, wherein one of the source region and the drain region is connected to an anode of the light-emitting element via a light-emission control transistor that has the first structure.

Aspect 17

The display device of, for example, aspect 14, wherein another one of the source region and the drain region is connected to a power supply line via a power supply transistor that has the first structure.

Aspect 18

The display device of, for example, aspect 14, wherein another one of the source region and the drain region is connected to the first gate electrode of the drive transistor via a threshold value control transistor that has the second structure.

Aspect 19

The display device of, for example, any one of aspects 1 to 18, wherein the light-emitting element is an organic light-emitting, diode or a quantum-dot light-emitting diode.

Aspect 20

A method of manufacturing a display device including a pixel circuit and a light-emitting element, the pixel circuit including: a transistor with a first structure including a crystalline silicon semiconductor film, a first gate insulation film, and a first gate electrode; a transistor with a second structure including an oxide semiconductor film, a second gate insulation film, and a second gate electrode; and a capacitive element, the method including: a step of forming a crystalline silicon semiconductor film; a step of forming a first gate insulation film overlying the crystalline silicon semiconductor film; a step of forming a first metal layer overlying the first gate insulation film; a step of forming a first interlayer insulation film overlying the first metal layer; a step of forming an intermediate metal layer overlying the first interlayer insulation film; a step of forming an oxide semiconductor film overlying the intermediate metal layer;

a step of forming an intermediate insulation layer overlying the oxide semiconductor film; a step of forming a second metal layer overlying the intermediate insulation layer; and a step of forming a second interlayer insulation film overlying the second metal layer, wherein a first capacitor electrode of the capacitive element is formed by patterning the intermediate metal layer, the second gate electrode and a second capacitor electrode of the capacitive element are formed by patterning the second metal layer, and the second gate insulation film and a dielectric film of the capacitive element are formed by patterning the intermediate insulation layer.

Aspect 21

The method of, for example, aspect 20, wherein the patterning of the second metal layer and the patterning of the intermediate insulation layer are performed successively using a same mask.

The invention claimed is:

1. A display device comprising:
 a pixel circuit including:
  at least one transistor with a first structure comprising a crystalline silicon semiconductor film and a first gate electrode;
  a transistor with a second structure including an oxide semiconductor film and a second gate electrode, and
  a capacitive element;
 a light emitting element;
 a first interlayer insulation film covering the first gate electrode;
 a second interlayer insulation film covering the second gate electrode;
 a first gate insulation film between the crystalline silicon semiconductor film and the first gate electrode; and
 a second gate insulation film between the oxide semiconductor film and the second gate electrode,
 wherein;
 the at least one transistor with the first structure includes a drive transistor,
 the capacitive element includes:
  a first capacitor electrode electrically connected to the first gate electrode of the drive transistor,
  a second capacitor electrode positioned opposite the first capacitor electrode, and
  a dielectric film between the first capacitor electrode and the second capacitor electrode,
 the dielectric film is disposed in a different layer than are the first interlayer insulation film and the second interlayer insulation film, and
 the dielectric film is made of a same material and in a same layer as the second gate insulation film.

2. The display device according to claim 1, wherein the capacitive element overlaps a channel of the drive transistor in a plan view.

3. The display device according to claim 1, wherein the dielectric film and the second gate insulation film are formed in an independently insular manner.

4. The display device according to claim 1, wherein
 the oxide semiconductor film is formed overlying the crystalline silicon semiconductor film, and
 the transistor with the first structure and the transistor with the second structure are of top-gate types.

5. The display device according to claim 4, further comprising:
 a first metal layer containing the first gate electrode;
 a second metal layer containing the second gate electrode;
 a third metal layer disposed overlying the second interlayer insulation film; and
 an intermediate metal layer disposed overlying the first interlayer insulation film and underlying the oxide semiconductor film, wherein
 the first capacitor electrode is contained in the intermediate metal layer.

6. The display device according to claim 5, wherein the second capacitor electrode is contained in the second metal layer.

7. The display device according to claim 5, wherein the first gate electrode of the drive transistor and the first capacitor electrode are connected via a contact hole formed in the first interlayer insulation film.

8. The display device according to claim 5, wherein
 the oxide semiconductor film includes a conducting portion that is modified into a conductor,
 a relay electrode is provided in contact with the conducting portion, and
 the relay electrode is contained in the intermediate metal layer.

9. The display device according to claim 1, wherein
 the first interlayer insulation film contains silicon nitride, and
 the second interlayer insulation film contains silicon oxide.

10. The display device according to claim 1, wherein the first capacitor electrode is connected to a power supply line via a resetting transistor that has the second structure.

11. The display device according to claim 1, wherein the second capacitor electrode is connected to an initialization signal line via an initialization transistor that has the second structure.

12. The display device according to claim 1, wherein the crystalline silicon semiconductor film of the drive transistor includes a source region and a drain region at both ends of a channel of the drive transistor.

13. The display device according to claim 12, wherein one of the source region and the drain region is connected to a data signal line via a write transistor that has the first structure.

14. The display device according to claim 12, wherein one of the source region and the drain region is connected to an anode of the light-emitting element via a light-emission control transistor that has the first structure.

15. The display device according to claim 12, wherein one of the source region and the drain region is connected to a power supply line via a power supply transistor that has the first structure.

16. The display device according to claim 12, wherein one of the source region and the drain region is connected to the first gate electrode of the drive transistor via a threshold value control transistor that has the second structure.

17. The display device according to claim 1, wherein the light-emitting element is an organic light-emitting diode or a quantum-dot light-emitting diode.

18. A display device comprising:
 a pixel circuit including:
  a transistor with a first structure comprising a crystalline silicon semiconductor film and a first gate electrode;
  a transistor with a second structure including an oxide semiconductor film and a second gate electrode, and
  a capacitive element;
 a light emitting element;
 a first interlayer insulation film covering the first gate electrode; and
 a second interlayer insulation film covering the second gate electrode, wherein:

the transistor with the first structure includes a drive transistor, the capacitive element includes:
- a first capacitor electrode electrically connected to the first gate electrode of the drive transistor,
- a second capacitor electrode positioned opposite the first capacitor electrode, and
- a dielectric film between the first capacitor electrode and the second capacitor electrode, the dielectric film is disposed in a different layer than are the first interlayer insulation film and the second interlayer insulation film, and the second capacitor electrode is connected to an initialization signal line via an initialization transistor that has the second structure.

* * * * *